United States Patent [19]
Grider et al.

[11] Patent Number: 6,030,874
[45] Date of Patent: Feb. 29, 2000

[54] DOPED POLYSILICON TO RETARD BORON DIFFUSION INTO AND THROUGH THIN GATE DIELECTRICS

[75] Inventors: Douglas T. Grider, McKinney; Stanton P. Ashburn, Dallas; Katherine E. Violette, Dallas; F. Scott Johnson, Dallas, all of Tex.

[73] Assignee: Texas Instruments Incorporated, Dallas, Tex.

[21] Appl. No.: 09/007,060

[22] Filed: Jan. 13, 1998

Related U.S. Application Data

[60] Provisional application No. 60/035,876, Jan. 21, 1997.

[51] Int. Cl.$^7$ .................................................. H01L 21/336
[52] U.S. Cl. .......................... 438/301; 438/306; 438/528; 438/585
[58] Field of Search .............................................. 438/585

[56] References Cited

U.S. PATENT DOCUMENTS

| | | |
|---|---|---|
| 4,835,112 | 5/1989 | Pfiester et al. . |
| 5,393,676 | 2/1995 | Anjum et al. . |
| 5,489,550 | 2/1996 | Moslehi . |
| 5,585,286 | 12/1996 | Aronowitz et al. . |
| 5,633,177 | 5/1997 | Anjum . |
| 5,710,055 | 1/1998 | Kizilyalli . |
| 5,866,472 | 2/1999 | Moslehi . |

OTHER PUBLICATIONS

Stolk, et al., Carbon incorporated in silicon for suppressing interstitial–enhanced boron diffusion, Appl. Phys. Lett. 66 (11), 13 Mar. 13, 1995, © 1995 American Institute of Physics, pp. 1370–1372.

Nakayama, Satoshi, A P+ poly–Si gate with nitrogen–doped poly–Si layer for deep submicron PMOSFEts, NTT LSI Laboratories, Abstract No. 301., p. 445–446.

Okazaki, et al., Characteristics of Sub–1/4–$\mu$m Gate Surface Channel PMOSFET's Using a Multilayer Gate Structure of Boron–Doped Poly–Si on Thin Nitrogen–Doped Poly–Si, 1994 IEEE, p. 2369–2375.

Okazaki, et al., Sub–1/4–$\mu$m Dual–Gate CMOS Technology Using In–Situ Doped Polysilicon for nMOS and pMOS Gates, IEEE Transactions on Electron Devices, vol. 42, No. 9, Sep. 1995, p. 1583–1589.

Grider, et al., Ultra–Shallow Raised p+–n Junctions Formed by Diffusion from Selectively Deposited In–Situ Doped $Si_{0.7}Ge_{0.3}$, Journal of Electronic Materials, vol. 24, No. 10, 1995, p. 1369–1376.

*Primary Examiner*—John F. Niebling
*Assistant Examiner*—Jonathan Hack
*Attorney, Agent, or Firm*—Mark A. Valetti; Carl H. Hoel; Richard L. Donaldson

[57] ABSTRACT

An embodiment of the instant invention is a method of fabricating a semiconductor device which includes a dielectric layer situated between a conductive structure and a semiconductor substrate, the method comprising the steps of: forming the dielectric layer (layer 14) on the semiconductor substrate (substrate 12); forming the conductive structure (structure 18) on the dielectric layer; doping the conductive structure with boron; and doping the conductive structure with a dopant which inhibits the diffusion of boron. The semiconductor device may be a PMOS transistor or a capacitor. Preferably, the conductive structure is a gate structure. The dielectric layer is, preferably, comprised of a material selected from the group consisting of: an oxide, an oxide/oxide stack, an oxide/nitride stack, and an oxynitride. Preferably, the dopant which inhibits the diffusion of boron comprises at least one group III or group IV element. More specifically, it is preferably comprised of: carbon, germanium, and any combination thereof. Preferably, the steps of doping the conductive structure with boron and doping the conductive structure with a dopant which inhibits the diffusion of boron are accomplished substantially simultaneously, or the step of doping the conductive structure with boron is preformed prior to the step of doping the conductive structure with a dopant which inhibits the diffusion of boron are accomplished substantially simultaneously.

5 Claims, 1 Drawing Sheet

DOPED POLYSILICON TO RETARD BORON DIFFUSION INTO AND THROUGH THIN GATE DIELECTRICS

This is a Non Provisional application filed under 35 USC 119(e) and claims priority of prior provisional, Ser. No. 60/035,876 of inventor Grider, et al, filed Jan. 21, 1997.

FIELD OF THE INVENTION

The instant invention pertains to semiconductor devices and device fabrication, and more specifically to a process for preventing/retarding boron diffusion through thin gate dielectrics.

BACKGROUND OF THE INVENTION

Presently, there is a great demand for reduced semiconductor device dimensions to provide an increased density of devices, on the semiconductor chip, that are faster and consume less power. The scaling of the devices in the lateral dimension requires vertical scaling as well so as to achieve adequate device performance. This vertical scaling requires the thickness of the gate dielectric to be reduced so as to provide the required device performance. However, thinning of the gate dielectric provides a smaller barrier to dopant diffusion from the gate structure, through the dielectric, and into the substrate.

In order to use lower voltage supplies, reduce power consumption, and maximize transistor performance, boron doped gates are preferred for PMOS devices due to better short-channel control than phosphorous doped gates. Phosphorous doped gates result in buried channel PMOS devices while boron doped gates yield a surface channel device.

While boron doping of gate structures solves some problems it causes others, because boron is a rapid diffuser in polysilicon ("poly") and oxide. More specifically, because of the thermal cycles required in today's processing along with the continued down-scaling of the gate dielectrics, the diffusion of boron through the poly gate structure and the thin gate dielectric may cause damage to the underlying channel region along with degrading the dielectric reliability and reducing the control over the threshold voltage of the device. Hence, with thinner gate oxides and shorter channel lengths, any boron penetration into the channel region can cause loss of control over the threshold voltage of the device, and, in the worse case, cause the channel region to be short-circuited.

One attempt at solving this problem involves incorporating nitrogen into the polysilicon gate. However, this method has problems. First, nitrogen is a donor in silicon and, therefore, it may create an n-type layer at the polysilicon/gate insulator interface. Hence, this would counteract the benefit of having boron in the polysilicon gate structure. Second, the common source for nitrogen doping is $NH_3$, which introduces H and OH traps into the dielectric which can reduce the dielectric's charge-to-breakdown and degrade hot carrier stability.

It is, therefore, an object of the instant invention to provide a gate structure which will properly retard boron penetration into the substrate through the gate insulator without degrading the performance of the device. More generally, it is an object of the instant invention to provide a gate structure which will inhibit the dopant used to make the gate structure more conductive from penetrating into the channel region.

SUMMARY OF THE INVENTION

The embodiments of the instant invention provide methods which basically control the boron diffusion after the boron enters the gate structure but before it enters the gate dielectric. Using the methods of the instant invention, this is preferably accomplished by introducing dopants, other than boron, into portions of the polysilicon gate structure so as to retard the diffusion of boron through the dielectric into the substrate.

An advantage of the instant invention is that the dopants utilized in each of the embodiments are not effective donors or acceptors in silicon. In addition, these dopants can be readily incorporated in silicon using standard chemical-vapor deposition or ion implantation. Furthermore, the methods of the instant invention prevent the boron from penetrating the underlying dielectric layer, thereby reducing damage to the dielectric layer. In other words, it may be desirable for the boron to reach the dielectric layer because this maximizes inversion capacitance, which is important for higher drive currents. However, with standard processing (which require higher temperatures and extended times at these temperatures) the boron not only reaches the dielectric it rapidly passes through the dielectric and degrades both the device performance and the reliability of the dielectric. Hence, the embodiments of the instant invention assures that the boron does not rapidly diffuse through the dielectric without having to appreciably reduce the time and temperature required in subsequent standard processing steps.

An embodiment of the instant invention is a method of fabricating a semiconductor device which includes a dielectric layer situated between a conductive structure and a semiconductor substrate, the method comprising the steps of: forming the dielectric layer on the semiconductor substrate; forming the conductive structure on the dielectric layer; doping the conductive structure with boron; and doping the conductive structure with a dopant which inhibits the diffusion of boron. The semiconductor device may be a PMOS transistor or a capacitor. Preferably, the conductive structure is a gate structure. The dielectric layer is, preferably, comprised of a material selected from the group consisting of: an oxide, an oxide/oxide stack, an oxide/nitride stack, and an oxynitride. Preferably, the dopant which inhibits the diffusion of boron comprises at least one group III or group IV element. More specifically, it is preferably comprised of: carbon, germanium, and any combination thereof. Preferably, the steps of doping the conductive structure with boron and doping the conductive structure with a dopant which inhibits the diffusion of boron are accomplished substantially simultaneously, or the step of doping the conductive structure with boron is preformed prior to the step of doping the conductive structure with a dopant which inhibits the diffusion of boron are accomplished substantially simultaneously.

Another embodiment of the instant is a PMOS transistor comprising: a substrate, the substrate having a surface; a source region formed at the surface of the substrate; a drain region formed at the surface of the substrate and spaced away from the source region by a channel region; a gate structure overlying the channel region, the gate structure comprised of boron doped polysilicon; a thin insulating layer situated between the gate structure and the substrate; and wherein the gate structure includes at least one dopant which inhibits boron diffusion. Preferably, the dopant which inhibits the diffusion of boron comprises at least one group III or group IV element. More specifically, the dopant which inhibits the diffusion of boron is, preferably, comprised of an element selected from the group consisting of: carbon, germanium, and any combination thereof.

BRIEF DESCRIPTION OF THE DRAWINGS

FIGS. 1–2, 3b, 4b, and 5b are cross sectional views of a device fabricated using the method of another embodiment of the instant invention.

FIGS. 1–2, 3c, 4c, and 5c are cross sectional views of a device fabricated using the method of yet another embodiment of the instant invention.

DETAILED DESCRIPTION OF THE DRAWINGS

Figure 1:
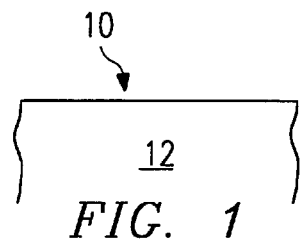
FIGS. 1–2, 3a, 4a, and 5a are cross sectional views of a device fabricated using the method of one embodiment of the instant invention.
Figure 2:
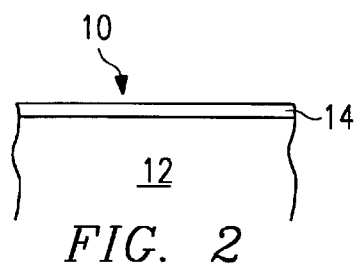

FIGS. 1–2, 3a, 4a, and 5a illustrate the method of one embodiment of the instant invention; FIGS. 1–2, 3b, 4b and 5b illustrate the method of another embodiment of the instant invention; and FIGS. 1–2, 3c, 4c, and 5c illustrate the method of yet another embodiment of the instant invention. Since the steps illustrated in FIGS. 1–2 are common to all three embodiments, they will only be described once.

Referring to FIGS. 1–2, for device 10 substrate 12 is provided and thin dielectric material is formed on substrate 12 to form dielectric layer 14. Dielectric layer 14 is preferably comprised of an oxide but may include an oxide/oxide or an oxide/nitride stack or an oxynitride. Preferably, dielectric layer 14 is on the order of approximately 5 to 100 A thick for gate lengths between 0.18 and 0.5 $\mu$m (more preferably 5 to 45 A thick for a transistor with a gate length of 0.18 $\mu$m, 35 to 60 A thick for a transistor with a gate length of 0.25 $\mu$m, 50 to 80 A thick for a transistor with a gate length of 0.35 $\mu$m, or 70 to 100 A thick for a transistor with a gate length of 0.5 $\mu$m).

Figure 3A:
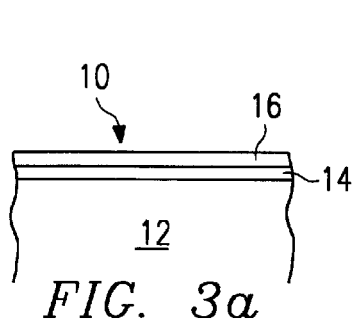
Figure 4A:
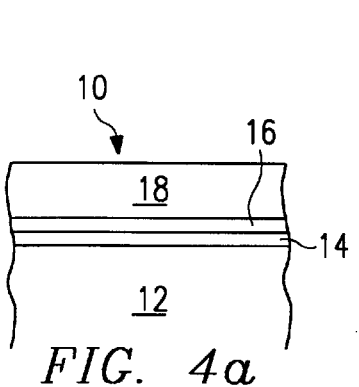
Figure 5A:
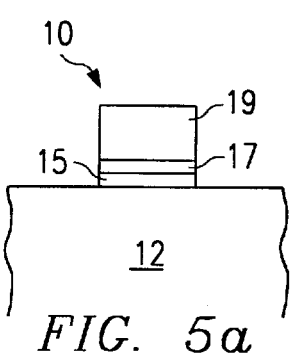

Referring to the embodiment illustrated in FIGS. 3a, 4a and 5a, either in one continuous process step or in a series of process steps, doped polysilicon layer 16 and undoped polysilicon layer 18 are formed (preferably using low pressure chemical-vapor deposition or rapid thermal chemical-vapor deposition). Preferably, this is accomplished by doping the polysilicon insitu as it is deposited so as to form layer 16 and, as the polysilicon is still being deposited, to turn off the source of the dopant so as to form undoped polysilicon layer 18. Doped layer 16 is preferably doped with carbon (preferably on the order of 0.1 to 1.0 atomic percent) or germanium (preferably on the order of 1 to 30 atomic percent) or some combination of C and Ge (preferably on the order of 0.1 to 1.0 atomic percent for C and 1 to 30 atomic percent of Ge) and is preferably on the order of 10 to 60 A thick. While it is preferable to dope layer 16 with carbon or germanium, almost any group IV element (or maybe a group III element) could be used. The source of the germanium dopant is preferably $GeH_4$ ($SiCl_2H_2$:$GeH_4$) and the source of the carbon dopant is preferably $Si(CH_3)H_2$ (or possibly $C(SiH_3)_4$). Preferably, the temperature is between 550 and 700° C. (more preferably around 625° C.), at a pressure around 2 to 100 Torr (more preferably around 3 Torr or 80 Torr), for a period of between 60 to 200 seconds. In addition, the $GeH_4$:DCS ratio is preferably around 0.05 to 0.2 depending on the temperature (more preferably around 0.1) and the $Si(CH_3)H_3$:DCS ratio is around 0.001 to 0.1 depending on the temperature (more preferably around 0.1 and 0.002, respectively). The Ge concentration in the film is preferably around 25% and the concentration of C in the films is around 1%.

Referring to FIG. 5a, after undoped layer 18 is formed, layers 14, 16 and 18 are patterned and etched so as to form the gate structure comprised of gate insulator 15, doped layer 17, and undoped layer 19. Next, boron is implanted (preferably, selectively implanted) into layer 19 of PMOS devices so as to enhance the conductivity of layer 19. This boron doping may be a separate processing step, it may be accomplished at the same time that the source/drain regions are formed, or it may be accomplished prior to the patterning and etching of layer 18.

Figure 3B:
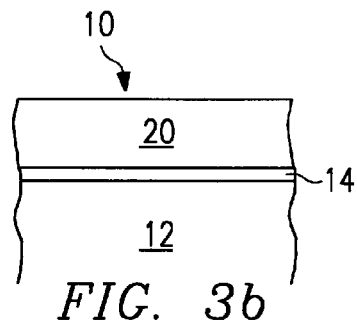
Figure 4B:
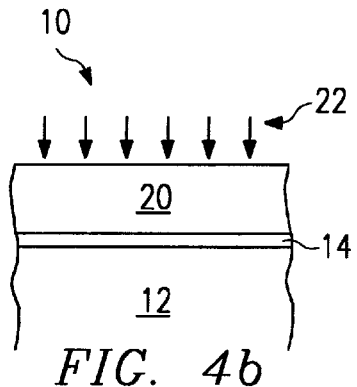
Figure 5B:
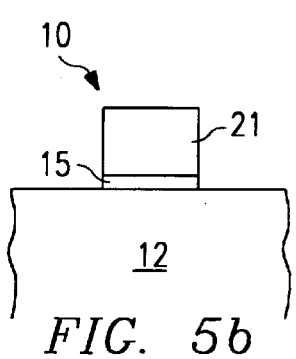

Referring to the embodiment illustrated in FIGS. 3b, 4b, and 5b, polysilicon layer 20 is formed on insulator 14. Preferably, this is accomplished by low pressure chemical-vapor deposition (LPCVD) or rapid thermal chemical-vapor deposition (RTCVD). Next, the boron diffusion retarding dopant(s) 22 is implanted into polysilicon layer 20. As was stated above, this is preferably either carbon or germanium, but may also include virtually any group III (if confined to PMOS devices) or IV elements. The implantation is preferably accomplished by ion implantation and may be done just prior to doping layer 20 with boron. Preferably, the germanium is implanted with an energy of around 10 to 200 keV at a dose of $1\times10^{14}$ to $1\times10^{16}$ ions/cm$^2$ and the carbon is implanted with an energy around 2 to 40 keV at a dose around $1\times10^{13}$ to $1\times10^{15}$ ions/cm$^2$.

Referring to FIG. 5b, after the boron diffusion retarding dopant(s) is implanted, layer 20 is patterned and etched so as to form the gate structure (comprised of polysilicon structure 21 and gate insulator 15). Next, boron is implanted into region 21 so as to enhance the conductivity of region 21. This boron doping may be a separate processing step, it may be accomplished at the same time that the source/drain regions are formed, or it may be accomplished prior to the patterning and etching of layer 20.

Figure 3C:
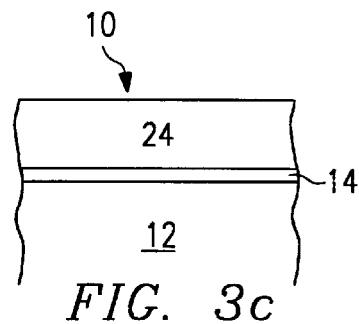
Figure 4C:
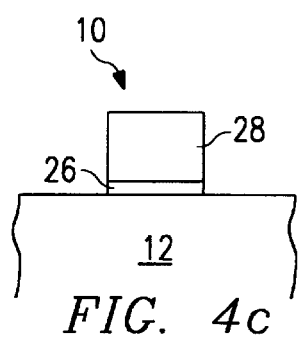
Figure 5C:
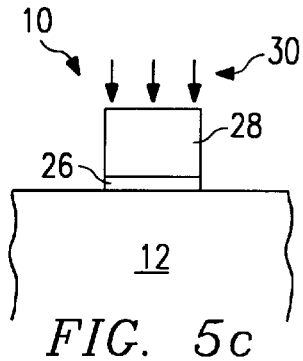

Referring to the embodiment illustrated in FIGS. 3c, 4c, and 5c, polysilicon layer 24 is formed on insulator 14. Preferably, this is accomplished by low pressure chemical-vapor deposition (LPCVD) or rapid thermal chemical-vapor deposition (RTCVD). Layer 24 is patterned and etched so as to form the gate structure (which includes polysilicon region 28 and gate insulator 26). Next, a patterning layer is formed over the entire device whereby only PMOS devices are exposed such that the boron diffusion retarding dopant(s) 30 is implanted only into the gate structures and source/drain regions of the PMOS devices. As was stated above, dopant 30 is preferably either carbon or germanium, but may also include virtually any group III or IV element. The implantation is preferably accomplished by ion implantation and is preferably done prior to doping region 28 with boron. Preferably for the carbon implantation the energy level is on the order of 2 to 40 keV (more preferably on the order of 20 keV) and the dose is around $1\times10^{13}$ to $1\times10^{15}$/cm$^2$ (more preferably around $1\times10^{14}$/cm$^2$) and this may be obtained from a chained implant at several energies to obtain a relatively uniform carbon distribution throughout the polysilicon. Preferably, for the germanium implant the implantation energy level is on the order of 10 to 200 keV (more preferably on the order or 100 keV) and the dose is around $1\times10^{14}$ to $1\times10^{16}$/cm$^2$ (more preferably around $1\times10^{15}$/cm$^2$) and this may be obtained from multiple implants to obtain a relatively uniform germanium distribution throughout the polysilicon. While it is preferable to use the above values, these implants should not penetrate the gate completely, thereby risking damage to the dielectric layer, and for carbon or germanium implanting subsequent to source/drain implantation, the carbon or germanium should not be so deep as to cause leakage in the source/drain regions.

Next, boron is implanted into region 28 so as to enhance the conductivity of region 28. This boron doping may be a separate processing step, it is accomplished at the same time that the source/drain regions are formed and just after the implantation of boron diffusion retarding dopants 30.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of fabricating a semiconductor device which includes a dielectric layer situated between a conductive structure and a semiconductor substrate, said method comprising the steps of:

forming said dielectric layer over said semiconductor substrate;

forming a polysilicon layer doped with a dopant which inhibits the diffusion of boron on said dielectric layer;

forming an undoped polysilicon layer on said polysilicon layer doped with a dopant which inhibits the diffusion of boron;

doping said undoped polysilicon layer with boron so as to form said conductive structure.

2. The method of claim 1, wherein said semiconductor device is a PMOS transistor or a capacitor.

3. The method of claim 1, wherein said dielectric layer is comprised of a material selected from the group consisting of: an oxide, an oxide/oxide stack, an oxide/nitride stack, and an oxynitride.

4. The method of claim 1, wherein said dopant which inhibits the diffusion of boron comprises at least one group III or group IV element.

5. The method of claim 1, wherein said dopant which inhibits the diffusion of boron is comprised of an element selected from the group consisting of: carbon, germanium, and any combination thereof.

* * * * *